(12) United States Patent
Wu

(10) Patent No.: US 7,372,732 B2
(45) Date of Patent: May 13, 2008

(54) PULSE WIDTH CONVERGED METHOD TO CONTROL VOLTAGE THRESHOLD (VT) DISTRIBUTION OF A MEMORY CELL

(75) Inventor: Chao I Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 129 days.

(21) Appl. No.: 11/286,510

(22) Filed: Nov. 23, 2005

(65) Prior Publication Data

US 2007/0115719 A1    May 24, 2007

(51) Int. Cl.
   *G11C 16/04* (2006.01)
(52) U.S. Cl. ............................ 365/185.03; 365/185.14; 365/185.19; 365/185.24; 365/185.28
(58) Field of Classification Search ........... 365/185.19, 365/185.24, 185.03, 185.28
   See application file for complete search history.

(56) References Cited

U.S. PATENT DOCUMENTS

| | | | | |
|---|---|---|---|---|
| 5,394,362 A | * | 2/1995 | Banks | 365/185.03 |
| 5,677,869 A | * | 10/1997 | Fazio et al. | 365/185.03 |
| 5,757,699 A | * | 5/1998 | Takeshima et al. | 365/185.24 |
| 6,046,934 A | * | 4/2000 | Lin | 365/185.03 |
| 6,172,909 B1 | | 1/2001 | Haddad et al. | |
| 6,219,276 B1 | | 4/2001 | Parker | |
| 6,320,786 B1 | | 11/2001 | Chang et al. | |
| 6,396,741 B1 | | 5/2002 | Bloom et al. | |
| 7,151,692 B2 | * | 12/2006 | Wu | 365/185.03 |
| 2004/0037144 A1 | * | 2/2004 | Pascucci et al. | 365/222 |
| 2004/0109358 A1 | * | 6/2004 | Roohparvar et al. | 365/185.33 |
| 2005/0083772 A1 | * | 4/2005 | Roohparvar et al. | 365/232 |
| 2005/0127428 A1 | * | 6/2005 | Mokhlesi et al. | 257/315 |
| 2005/0157555 A1 | * | 7/2005 | Ono et al. | 365/185.18 |
| 2005/0219906 A1 | * | 10/2005 | Wu | 365/185.21 |
| 2005/0237813 A1 | * | 10/2005 | Zous et al. | 365/185.24 |
| 2005/0281085 A1 | * | 12/2005 | Wu | 365/185.19 |
| 2006/0077736 A1 | * | 4/2006 | Nakagawa et al. | 365/201 |

FOREIGN PATENT DOCUMENTS

JP     10199267 A   *  7/1998
JP   2000222892 A   *  8/2000

OTHER PUBLICATIONS

C.C. Yeh et al. "A novel low power program/erase, small pitch, 2-bit per cell flash memory," IEDM Technical Digest, 2002, 931-934.
"Flash Memory: Intel Multilevel Cell (MLC) Flash Technology," copyright © 2005, www.SemiconFarEast.com, printout from website: http:www.semiconfareast.com/flash-memory.htm, printout date: Nov. 23, 2005, 3 pages.

* cited by examiner

*Primary Examiner*—Ly Duy Pham
(74) *Attorney, Agent, or Firm*—Akin, Gump, Strauss, Hauer & Feld LLP

(57) ABSTRACT

A method of operating on a plurality of non-volatile multi-level memory cells is disclosed. The memory cells have at least a first, second, third and fourth program level. Each of program levels corresponds to a different binary state and has a voltage threshold distribution. A constant operating voltage is maintained on the memory cells and the voltage threshold distribution of the memory cell is controlled by varying a pulse width of a programming pulse applied to each memory cell.

10 Claims, 14 Drawing Sheets

```
Load MLC (ex:00,01,10,11) data into buffer
                    ↓
          Check the program state
                    ↓
      if 00 state=>use PW=50ns to 5V
      if 01 state=>use PW=25ns to 4V
      if 10 state=>use PW=10ns to 3V
      if 11 state=>Without program
                   or use PW=5ns to 2V
                   (reduce over erase issue)
```

CHE Program at Bit-L
to high-Vt

Load MLC (ex:00,01,10,11) data into buffer

Check the program state if 00 state=>use PW=50ns to 5V
if 01 state=>use PW=25ns to 4V
if 10 state=>use PW=10ns to 3V
if 11 state=>Without program
　　　　　　 or use PW=5ns to 2V
　　　　　　 (reduce over erase issue)

FIGURE 5

Erase state at high-Vt

BTBHH Program at Bit-R to low-Vt

BTBHH Program at Bit-L to low-Vt

PULSE WIDTH CONVERGED METHOD TO CONTROL VOLTAGE THRESHOLD (VT) DISTRIBUTION OF A MEMORY CELL

BACKGROUND OF THE INVENTION

The present invention relates to a method of controlling the voltage threshold (Vt) distribution utilizing a pulse width during the operation of a plurality of non-volatile multi-level memory cells, and more particularly, to non-volatile multi-level memory cells having a two-bit per cell storage layer. The method is applicable to the operations of programming and erasing non-volatile multi-level memory cells, such as, but not limited to, nitride trapping memory and PHINES cells.

Non-volatile multi-level memory refers to types of semiconductor memories that maintain stored information when a power source is not applied to the memory. Some examples of non-volatile memory cells include Mask Read-Only Memory (Mask ROM), Programmable Read-Only Memory (PROM), Erasable Programmable Read-Only Memory (EPROM) and Electrically Erasable Programmable Read-Only Memory (EEPROM). Typically, non-volatile memory cell data can be programmed, read and/or erased, and the programmed data can be stored for long periods of time prior to being erased.

Nitride read only memory (nitride trapping memory) is a type of EBEPROM memory that uses charge-trapping for data storage. An nitride trapping memory cell is typically composed of a metal-oxide-silicon field effect transistor (MOSFET) having a top dielectric layer, such as an ONO (oxide-nitride-oxide) layer disposed between a gate and a substrate with source and drain regions in a portion of the semiconductor substrate material. The nitride material in the ONO top dielectric layer has the capability to "trap" charges (electrons) when the cell is "programmed." Charge localization is the ability of the nitride material to store the charges without significant lateral movement of the charges throughout the nitride layer, thus the charges are independent to the other. A typical nitride trapping memory cell utilizes a relatively thick tunnel oxide layer, which typically negatively influences the time it takes to erase a memory cell. The nitride trapping memory cell can be contrasted with conventional "floating gate" memory cells, wherein the floating gate is conductive. However, the charge is free to spread laterally throughout the entire floating gate, and charge is transferred through the tunnel oxide layer. Programming (e.g., charge injection) of the charge-trapping layer in nitride trapping memory cells can be carried out by various hot carrier injection methods such as channel hot electron injection (CHE), source side injection (SSI) or channel initiated secondary electron (CHISEL), both of which inject electrons into the nitride layer. Localized charge-trapping technology allows two separate charge bits per cell, thus resulting in a doubling of memory density per cell.

The erasing operation (i.e., charge removal) is preformed by applying a positive gate voltage, which permits hole tunneling through the ONO top dielectric layer from the gate. Erasing in nitride trapping memory cells are typically carried out by band-to-band hot hole tunneling (BTBHHT). However, BTBHHT erasing causes many reliability issues and degradation of the nitride trapping memory cells by increasing charge losses after many program/erase operation cycles.

The reading operation is carried out in either a forward or a reverse direction. Reading a nitride trapping memory cell does not affect the cell data. The nitride trapping memory cell can be repeatedly programmed, read and erased by known voltage application techniques.

A PHINES memory cell is another type of nitride trapping storage non-volatile memory, which uses an n-channel MOSFET with a modified ONO top dielectric layer. The PHINES memory cell typically uses a Silicon-Oxide-Nitride-Oxide-Silicon (SONOS) cell structure, which is arranged in a NAND array with the charges stored in the nitride layer. A PHINES memory cell utilizes two physical bits of storage, and thus has advantageous capabilities in high scaling applications. Other advantages for the PHINES cell are that it has low power requirements and provides better data retention over many programming/erasing operations throughout its life as compared to similar two-bit non-volatile memory cells.

For PHINES cells, techniques such as Fowler-Nordheim (FN) injection and band-to-band hot-hole injection (BTB-HHT) are typically used for erasing and programming operations, respectively. Erasing a PHINES cell uses FN injection, which exhibits a self-convergent behavior without creating over-erasing issues while maintaining efficiency. The programming is done by lowering the local voltage threshold (Vt) through the BTBHHT injection technique. Low (Vt) state leakage can be controlled and suppressed in a PHINES cell via a bit-by-bit program and verify technique. The programming and erasing operations for the PHINES memory cell are low power operations, which are ideal for mass storage applications that are often complex in design.

The voltage threshold (Vt) of the non-volatile memory cell is proportional to the amount of charge that is retained in the charge storage layer. As the charge changes, the voltage threshold changes to a different level. The voltage thresholds define the program levels of the multi-level memory cells that correspond to program states. The program states represent binary data stored in the memory cells.

A multi-level non-volatile memory cell is implemented by identifying multiple and distinct voltage threshold ranges within the cell. Each distinct voltage threshold range corresponds to predetermined values for the set of data bits. The specific relationship between the data programmed into the memory cell and the voltage threshold levels of the cell depends upon the programming operation scheme adopted for the cells. To achieve proper data storage for a multi-level memory cell, the multiple ranges of voltage thresholds should be separated from each other by sufficient margin so that the level of the memory cell can be programmed or erased in an unambiguous manner. The voltage threshold separations from each level define a distribution within the cell that corresponds to the program levels and program states. By controlling the voltage threshold distributions, the threshold margins are less likely to encroach on the program levels, thereby eliminating any problems with the voltage threshold affecting the others.

When electrons accumulate in the charge storage layer, the layer becomes negatively charged and the voltage threshold of the memory cell rises to a higher level. The tighter the voltage threshold distribution, the easier it is to unmistakably read the memory cells. The need for controlling the voltage threshold distributions is even more important with multi-level memory cells, because the read process needs to distinguish between the different voltage threshold distributions without resulting in errors. To control the voltage threshold distribution, a pulse width method is used to program the memory cells.

Prior art methods for controlling the voltage threshold (Vt) distribution require more complicated techniques than that of the present invention. U.S. Pat. No. 6,219,276 (Parker) and U.S. Pat. No. 6,320,786 (Chang et al.) disclose methods that requires the use of multiple programming voltages for achieving multiple voltage threshold (Vt) distributions, which increases the design complexity, wherein the programming voltages are not constant. In addition, Parker teaches a method of utilizing a number of pulses to control the voltage threshold distribution. Specifically, the greater number of pulses used to program a cell, the narrower the voltage threshold (Vt) distribution. In contrast, the method of the present invention utilizes the pulse width and not the number of pulses to control the voltage threshold (Vt) distribution.

Additionally, U.S. Pat. No. 6,396,741 (Bloom et al.) discloses a method utilizing a stepping of the drain voltage to program the non-volatile memory cell. This method increases the design complexity for controlling program voltages since the voltages are not constant during the programming operation.

U.S. Pat. No. 6,172,909 (Haddad et al.) discloses a method to tighten the threshold voltage distribution curve in a memory cell. Haddad is directed to a soft-programming method, wherein the soft-programming method is applied after an erase operation to avoid over-erase issues, thereby controlling the Vt distribution. Furthermore, Haddad does not control the voltage threshold distribution of each memory cell by varying a pulse width of a programming pulse that is applied to each memory cell. In contrast, the present invention utilizes a program method that controls the Vt distribution for different Vt levels by varying a pulse width of a programming pulse applied to each memory cell.

The prior art methods cited above, rely on more complex designs that are less efficient and more costly to implement, which impinge on the overall MLC operation and effectiveness of the non-volatile memory cell, regardless of whether one uses nitride trapping memory or PHINES cells. Moreover, the prior art methods do not consider issues related to the over-programming and over-erasing of memory cells, wherein these issues have a detrimental effect on the memory cell's charge retention as well as the cell's life cycle.

BRIEF SUMMARY OF THE INVENTION

The present invention teaches a method utilizing a pulse width to control the voltage threshold (Vt) distribution for a plurality of multi-level memory cells during a cell operation. Specifically, the plurality of cells are non-volatile memory cells that have a storage layer capable of storing two individual charge bits per cell. The charge storage layer of the non-volatile memory cell stores two bits of charges that define Multi-Level Cell (MLC) data, which is loaded into a buffer to determine a program state and the pulse width for the program level. Two preferred embodiments of two-bit non-volatile memory cells are a Nitride Read Only Memory (nitride trapping memory) and Programming by Hot-hole Injection Nitride Electron Storage (PHINES) cells. One benefit of the present invention is that the two-bit charge storage layer of the plurality of cells have lower power requirements for implementing the programming and erasing operations. Thus, the method has greater efficiency than that of prior art methods. Other benefits that are achieved by the present invention are good charge/data retention and high scaling capabilities for these types of multi-level memory cells.

A non-volatile memory cell that can store two individual bits of charge data has a structure that typically comprises a semiconductor substrate, a source region, a drain region, a gate, a first oxide layer, a charge storage layer and a second oxide layer. The present invention applies a constant first operating (bias) voltage to the drain and a second constant operating (bias) voltage to the gate, wherein the second operating (bias) voltage has a greater magnitude than that of the first operating (bias) voltage. The constant operating voltage is applied for programming and erasing operation according to the method of the present invention. The method further includes loading Multi-Level Cell (MLC) data into a buffer, checking the MLC data for its program state and selects the pulse width for completing the cell operation, wherein the operation is programming or erasing. The pulse width of the present invention is used to control the voltage threshold (Vt) distribution for the plurality of non-volatile multi-level memory cells, thus allowing the operation to converge to a defined level.

The present invention uses a constant operating (bias) voltage, in contrast to the prior art discussed above wherein the operating (bias) voltages applied to the gate and the drain (also, referred to in the prior art references as "program voltages," "programming voltages") are varied.

The pulse width is also used to control the programming speed for different voltage thresholds (Vt) levels of Multi-Level Cells (MLC). Accordingly, the present invention eliminates the need for complicated circuitry to control the program and erase operating voltages since the operating voltages are constant during either operation, thus a simpler circuit design may implemented to improve to the overall efficiency of the present invention.

The pulse width also controls another aspect of the present invention that is used to control voltage threshold (Vt) distributions, wherein a smaller pulse width (e.g., short time duration) is used to program "medium states" of Multi-Level Cells (MLC). The medium states of the MLC are the states between the lowest state and the highest state. For example, the medium states of a two-bit memory cell are 01 and 10.

Consequently, tighter voltage threshold (Vt) distributions are achieved for the Multi-Level Cells (MLC) for each operation. In addition, controlling the voltage distribution (Vt), improves the issues related to over-programming and over-erasing operations, thus making the method more effective without putting unwanted stress on the memory cells.

In addition, the present method utilizes constant operating voltages for programming or erasing the plurality of multi-level memory cells, which allow for an overall simpler design implementation, whereas the methods disclosed in U.S. Pat. Nos. 6,219,276 and 6,320,786 use operating voltages that are not constant, thereby requiring a more complex and less efficient implementation. Furthermore, U.S. Pat. No. 6,396,741 discloses a method that uses drain voltage stepping, for controlling voltage threshold (Vt) distributions in non-volatile memory cells.

BRIEF DESCRIPTION OF THE DRAWINGS

The accompanying drawings are included to provide a further understanding of the invention and are incorporated into this specification. The drawings illustrate preferred embodiments of the present invention, which do not impose any limitations to the present invention, and together with the text of the specification, explain the principles and features of the present invention.

FIG. 5 shows a flow diagram for completing a nitride trapping memory two-program one-read (OPOR) operation utilizing the method of the present invention.

DETAILED DESCRIPTION OF THE INVENTION

Figure 1:
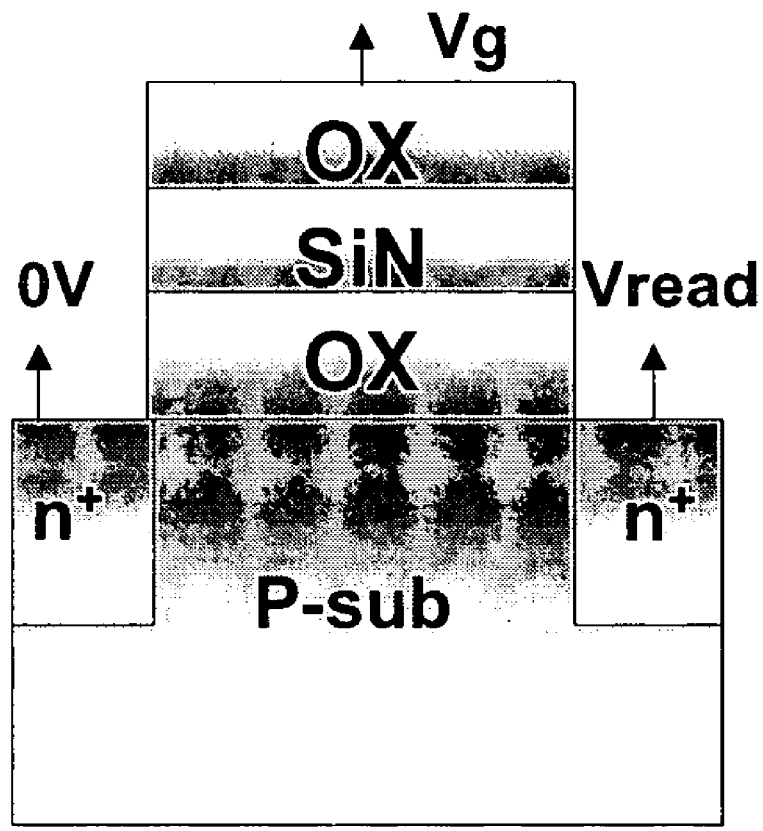
FIG. 1 shows an erase state at a low voltage threshold (Vt) of a two-bit non-volatile memory operated nitride trapping memory cell.

A pulse width converged method is used to control voltage threshold (Vt) distributions during the operation of a plurality of multi-level storage memory cells. Particularly, the method of the present invention is related to a plurality of nitride trapping memory cells and a plurality of PHINES cells, but other multi-level memory cells can be used with the present invention. Furthermore, the present invention relates to the operation on a plurality of non-volatile multi-level memory cells, wherein the operation includes programming and erasing, and the cells are capable of storing multiple independently charge bits (e.g., data bits) in a charge storage layer.

The present invention controls the voltage threshold (Vt) distributions during the operation of a plurality non-volatile memory cells by varying the pulse width while maintaining constant operating voltages. The operation of the non-volatile multi-level memory cells is either a programming operation or an erasing operation, wherein programming is a technique of writing data in a memory cell and erasing is a technique of clearing data from the memory cells. The drain and gate of the cell are biased with constant first and second operating voltages, respectively. The second operating voltage is greater in absolute magnitude than that of the first operating voltage. The charge storage layer of the non-volatile multi-level memory cell stores two bits defining MLC data, which are loaded into a buffer to determine a program state and the pulse width. The buffer is used to store data before programming the data to the memory cells. For example, memory data, such as 1010101011111111 is to be stored into the memory cells. According to a preferred embodiment of the present invention, the memory data is first loaded into the buffer and then the method begins to program the data into the memory cells.

A multi-level cell can be programmed to contain more than one voltage level. For example, a two-level memory has a first, second, third and fourth state, which correspond to four different program levels. Each voltage level of the program state corresponds to bits of data represented in a binary form such as 00, 01, 10 and 11, wherein each binary digit represents an individual and independent charge for a storage location in the charge storage layer of the non-volatile memory cell. For example, a non-volatile two-level memory cell may be programmed with a program levels of about 5.0V, 4.0V, 3.0V and 2.0V that correspond to the binary states 00, 01, 10 and 11, respectively.

Multi-level cells having more then two levels are also within the scope of the present invention. Such cells will have more than four states (e.g., program levels). For example, a three-level cell will have eight binary states from 000 to 111.

The method further includes, applying a pulse width to the cell at the drain and source in a sequence that provides a way to program the Left bit first and then the Right bit or the Right bit first and then the Left bit accordingly.

The pulse width controls the (Vt) distributions during the non-volatile multi-level cell operation. In one preferred embodiment of the present invention, the pulse width is about 5 nanoseconds (e.g., "without program") to about 50 nanoseconds for a nitride trapping memory cell and is about 1 nanoseconds (e.g., "without program") to about 10 nanoseconds for a PHINES cell. Wherein for the lowest Vt states, the method does not program (e.g., "without program") the memory cell. In addition, defining a small pulse width of a programming pulse programs the memory cell, wherein the smallest pulse width of the programming pulse is similar to a soft-programming technique. For a PHINES cell operation, its erase state is defined at 00, which is a high Vt state therefore, programming is not necessary but, a pulse width of about 1 ns could be used for the programming operation. The pulse width converged method increases the operation efficiency of the plurality of non-volatile multi-level memory cells, thereby providing an overall increase in operational speed. Furthermore, the pulse width controls the voltage threshold (Vt) distribution for a particular program time, wherein a longer pulse width develops a larger voltage threshold (Vt) distribution and a shorter pulse width develops a smaller (Vt) distribution.

When there are memory cells that have program levels with voltage threshold (Vt) distributions that are either too large or too small, they can be interpreted as misrepresented data for the next higher level or the next lower program level. To prevent this misinterpretation, which could be caused by a read operation of the multi-level memory cells, the present invention controls the voltage threshold (Vt) utilizing a pulse width during its programming/erasing operation, thus providing better data retention, stability and charge margin. The charge margin is the voltage differential between the voltage threshold (Vt) distributions and is kept to a minimum according to the method of the present invention.

One preferred embodiment of the present invention relates to the operation of a plurality of nitride trapping memory non-volatile multi-level memory cells. FIG. 1 shows an erase state of a nitride trapping memory cell, wherein the erase state of the nitride trapping memory cell is at a low voltage threshold (Vt). The nitride trapping memory cell includes a semiconductor P-substrate. The substrate has a first side, a second side and a top surface. A portion of the substrate has a source region and a drain region both, of n+ type, wherein the drain region is adjacent to the first side, the source region is adjacent to the second side and both regions are below the top surface of the substrate. The substrate further includes a channel interposed between the source region and the drain region in a portion of the substrate below the top surface. The nitride trapping memory cell further includes a first oxide layer and a charge storage layer, wherein the charge storage layer has a first side for storing a first charge bit and a second side for storing a second charge bit. The charge bits of the charge storage layer define Multi-Level Cell (MLC) data, which is loaded into a buffer for checking a program state and setting the pulse width for completing the operation. Buffer checking is based on each memory state that has a corresponding pulse width. For a lower Vt level of a nitride trapping memory, a smaller pulse width is define for the programming operation, in which the programming algorithm is controlled by the memory device.

In addition, the nitride trapping memory cell includes a second oxide layer and a gate that are formed on and/or above the substrate, thereby, providing conduction paths to the charge storage layer from the source and drain regions of the substrate.

Figure 2:
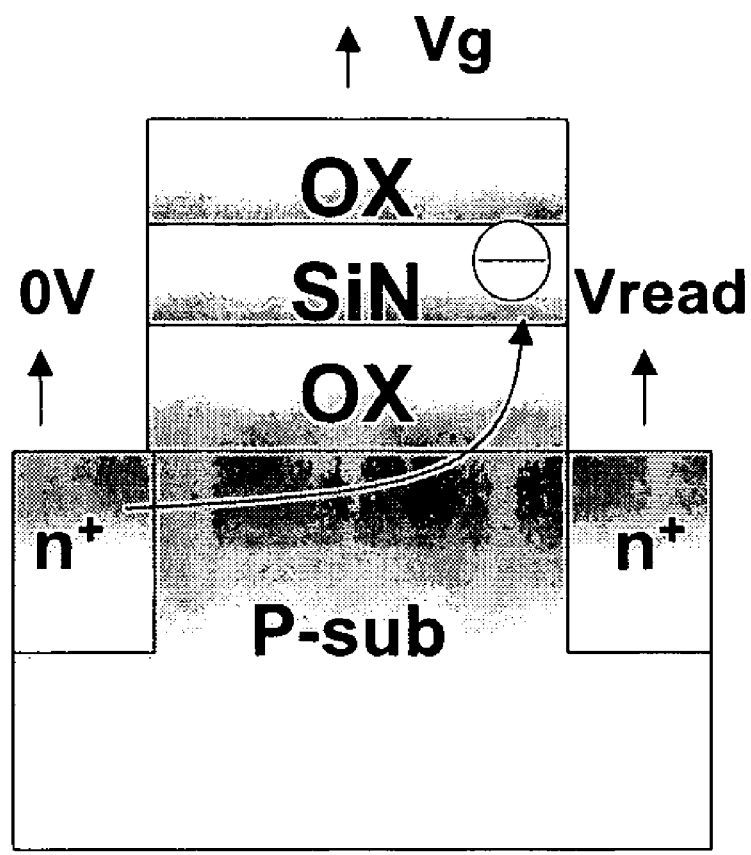
FIG. 2 shows a first bit programming operation of a two-bit non-volatile memory nitride trapping memory cell.
Figure 3:
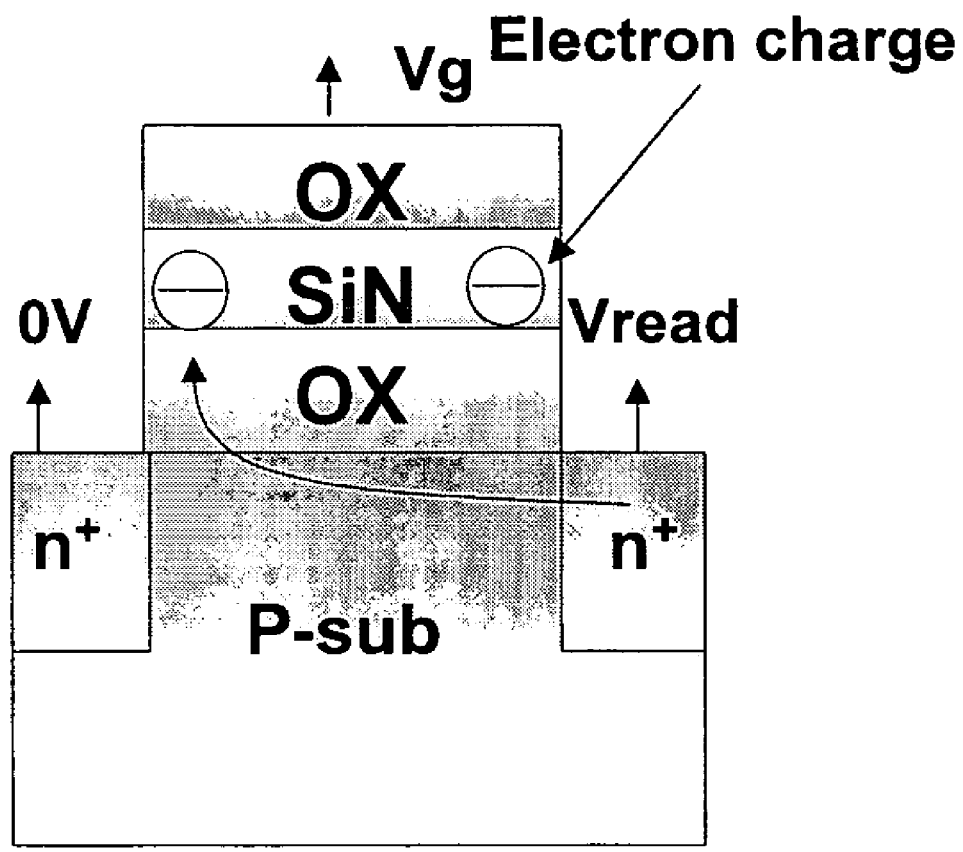
FIG. 3 shows a second bit programming operation of a two-bit non-volatile memory nitride trapping memory cell.

FIGS. 2 and 3 show a programming operation of a nitride trapping memory memory cell, wherein the nitride trapping memory is programmed by using Channel Hot Electron (CHE) for completing a two-side program with one-side read (TPOR).

Specifically, FIG. 2 illustrates the first-side programming operation for the nitride trapping memory cell, wherein the first charge bit is stored in the second side of the charge storage layer. The programming operation stores the charge bit by conducting an electron charge from the first side of the substrate to the second side of the charge storage layer through the conduction path.

Similarly, FIG. 3 illustrates the second-side programming of the nitride trapping memory cell, wherein the second charge bit is stored in the first side of the charge storage layer, by conducting an electron charge from the second side of the substrate to the first side of the charge storage layer through the conduction path. The first and second sides of the substrate are the drain and source regions and the charges from these regions are conducted and stored into either side of the charge storage layer of the nitride trapping memory non-volatile multi-level memory cell.

Figure 4:
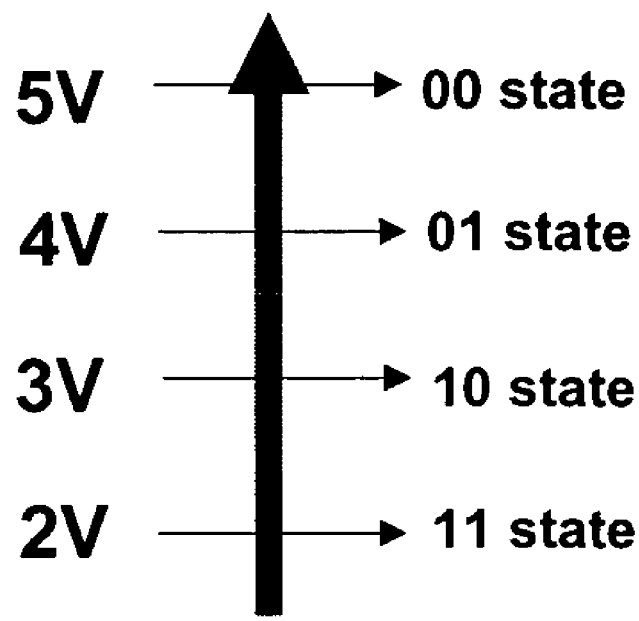
FIG. 4 shows a nitride trapping memory program level voltage threshold (Vt) distribution and its corresponding program state.

FIGS. 4 and 5 further illustrate the operation of the nitride trapping memory cell utilizing TPOR and CHE, wherein the Multi-Level Cell (MLC) data, which is loaded into a buffer, is checked to determine the program state and program level. The program state selects the pulse width to be used, wherein the program level is the voltage threshold (Vt).

FIG. 4 illustrates the correlation of the program levels as defined to the program state. The program levels are used for programming the nitride trapping memory cells from a low voltage threshold (Vt) to a high voltage threshold (Vt). Furthermore, the convergence of the voltage threshold (Vt) distribution is controlled during the cell operation.

FIG. 5 illustrates a flow diagram of the present invention for completing a two-side program and one-side read (TPOR) technique for the nitride trapping memory multi-level memory cell by using Channel Hot Electron (CHE) programming technique. Program voltages are biased at a constant voltage level to facilitate the programming operation. Typical operating voltages for the nitride trapping memory embodiment of the present invention are defined for the gate at about 10VDC and for the drain at about 5.5VDC. Next, MLC data is loaded into a buffer and checked to determine the program state and pulse width for the program level for completing the operation. The program level and pulse width allow for controlling different voltage threshold (Vt) distributions for the same program time of the nitride trapping memory non-volatile multi-level memory cell. Specifically, the pulse width is adjusted to control the convergence of the voltage threshold (Vt) distribution at the same programming time. Therefore, controlling the voltage threshold (Vt) allows for a simpler design than that of prior art methods, since the pulse width is the only parameter varied.

Figure 6:
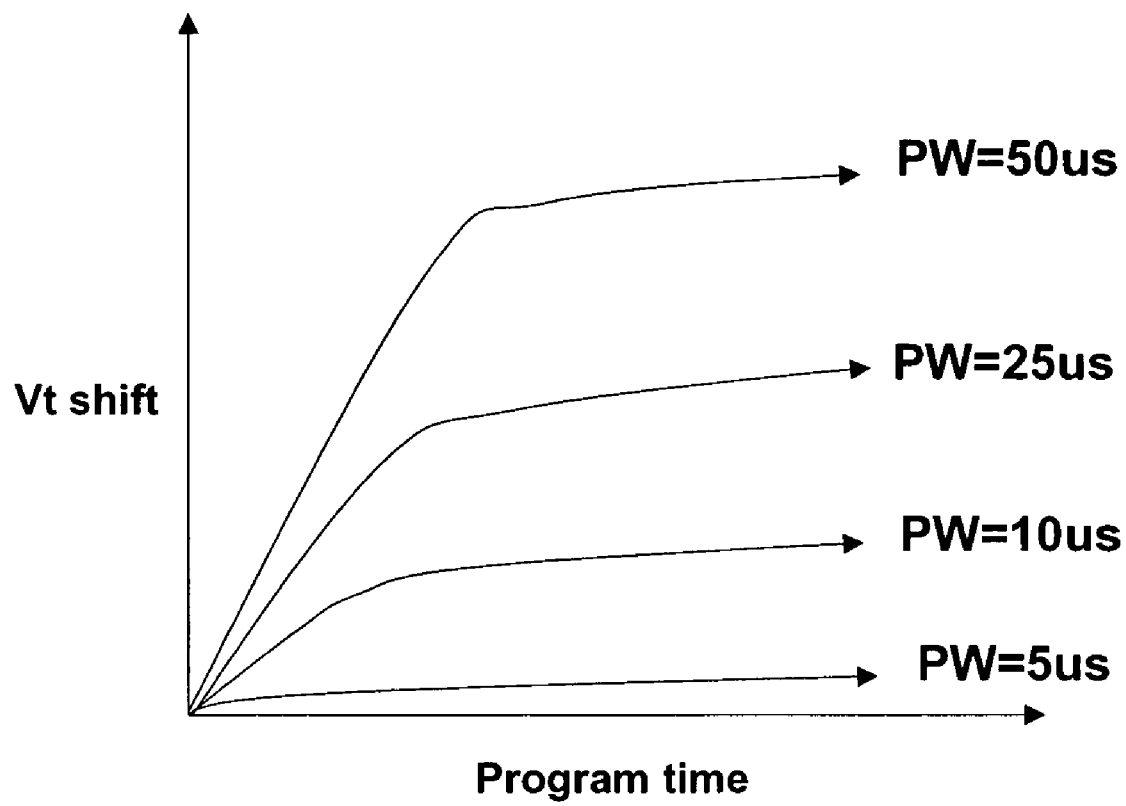
FIG. 6 shows theoretical voltage threshold (Vt) distributions according to the method of the present invention for a two-bit non-volatile memory nitride trapping memory cell.
Figure 7:
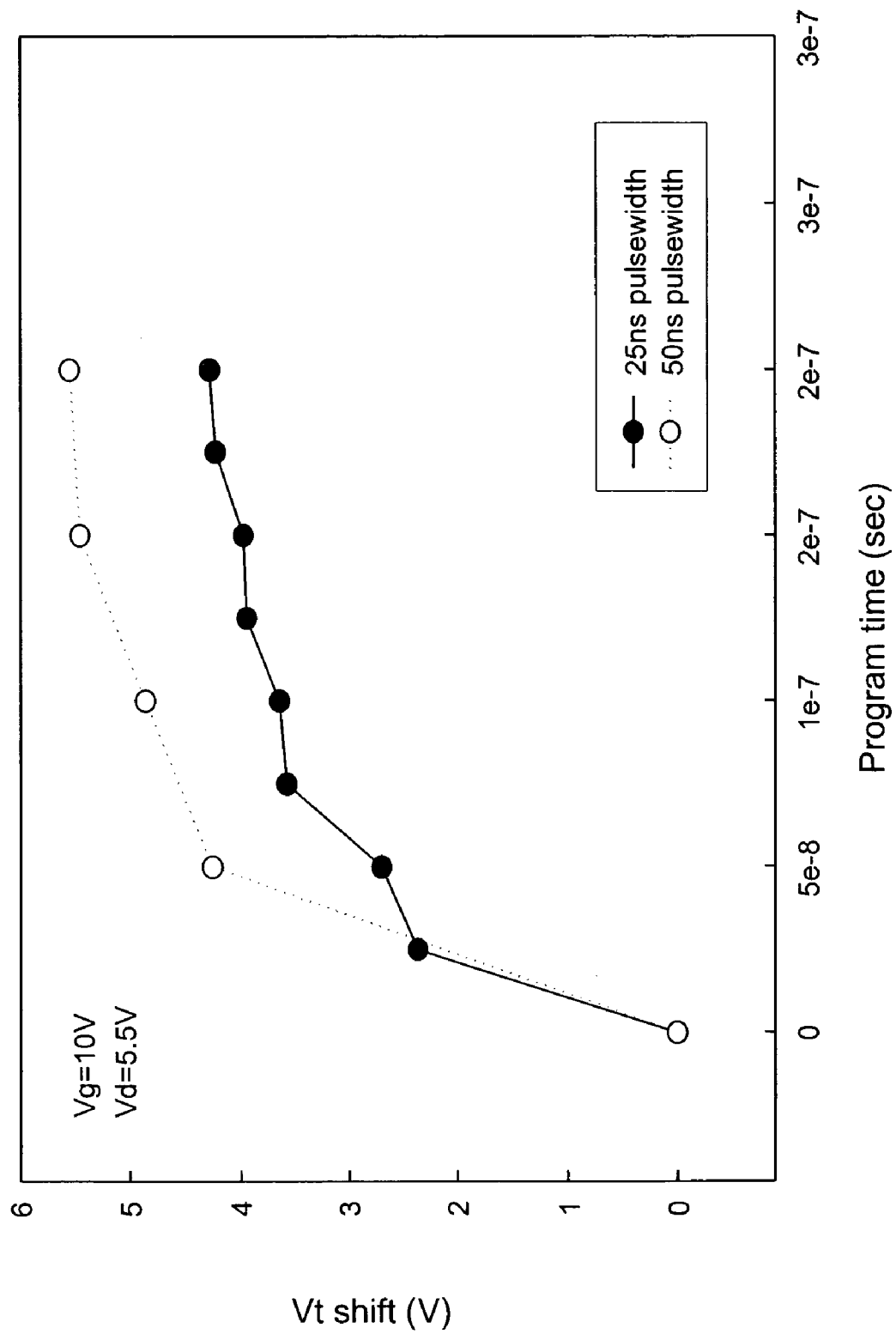
FIG. 7 shows experimental voltage threshold (Vt) distributions according to the method of the present invention for a two-bit non-volatile memory nitride trapping memory cell.

FIGS. 6 and 7 show the theoretical and the experimental voltage threshold (Vt) distributions for a nitride trapping memory multi-level memory cell, respectively. FIG. 6 illustrates a pulse width converged method to control a voltage threshold (Vt) distribution, and illustrates the effects of the pulse width on the voltage threshold (Vt) distribution of a nitride trapping memory non-volatile multi-level memory cell over the same program time.

FIG. 7 shows experimental voltage threshold (Vt) distributions for a nitride trapping memory multi-level memory cell utilizing TPOR-CHE programming operations. The method requires that the operating voltages (e.g., Vg=10V and Vd=5.5V) are kept constant during the operation. The curves in FIG. 7 represent different pulse widths (e.g., 25 nanoseconds (black circles) 50 nanoseconds (white circles)) and its effects on the voltage threshold (Vt) distribution. In addition, other pulse widths under the same programming operation would result in different voltage threshold (Vt) distributions (not shown).

Figure 8:
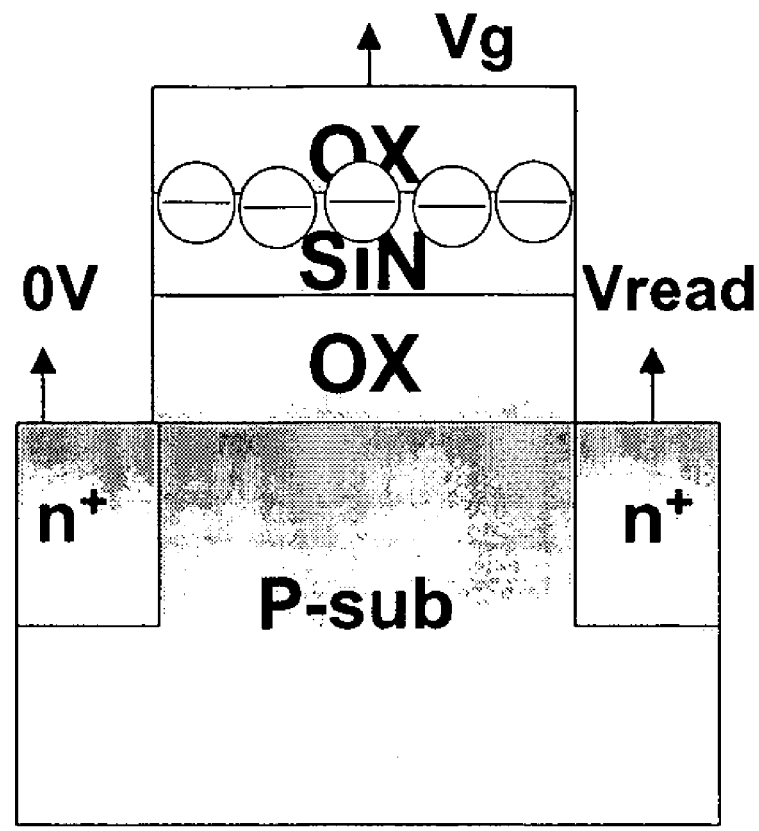
FIG. 8 shows the erase state at a high voltage threshold (Vt) of a two-bit non-volatile memory operated PHINES cell.

A second preferred embodiment of the present invention relates to the operation of a plurality of PHINES non-volatile multi-level memory cells. FIG. 8 shows an erase state of a PHINES multi-level memory cell, wherein the erase state of a PHINES memory cell is at a high voltage thresohold (Vt). The PHINES cell includes a semiconductor P-substrate, having a first side, a second side and a top surface. A portion of the substrate has a source region and a drain region both of n+ type, wherein the drain region is adjacent to the first side, the source is adjacent to the second side and both regions are below the top surface of the substrate. The substrate further includes a channel interposed between the source region and the drain region in a portion of the substrate below the top surface. The nitride trapping memory cell further includes a first oxide layer and a charge storage layer. The charge storage layer has a first side for storing a first charge bit and a second side for storing a second charge bit. The charge storage layer defines MLC data, which is loaded into a buffer and used to check a program state and to set the pulse width. In addition, the PHINES cell includes a second oxide layer and a gate that are formed on and/or above the substrate, thereby providing conduction paths to the charge storage layer from the source and drain regions in the substrate.

Figure 9:
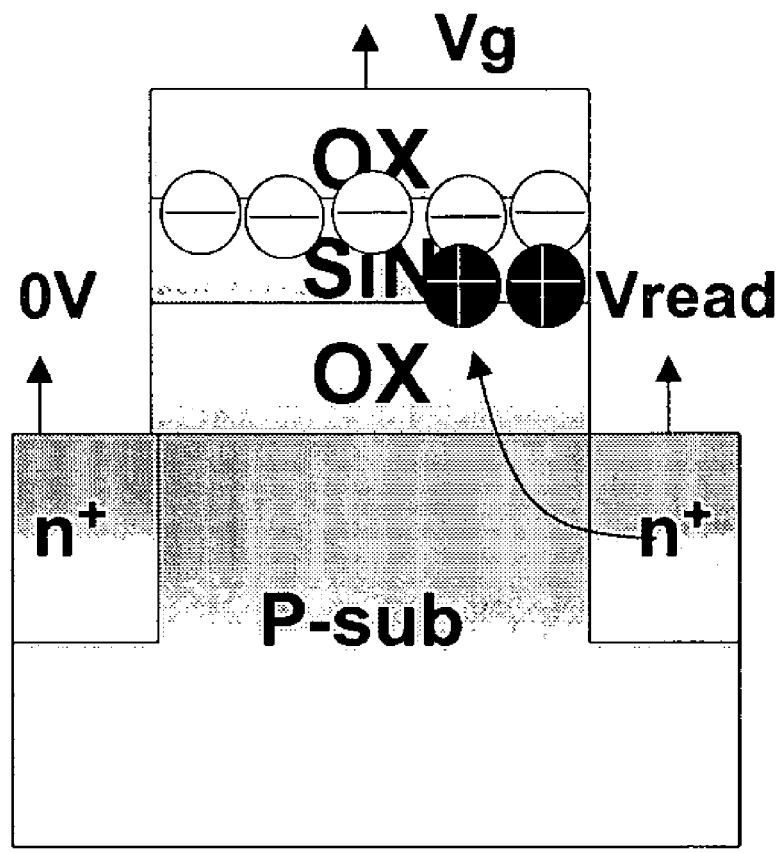
FIG. 9 shows a first bit programming operation of a two-bit non-volatile memory PHINES cell.
Figure 10:
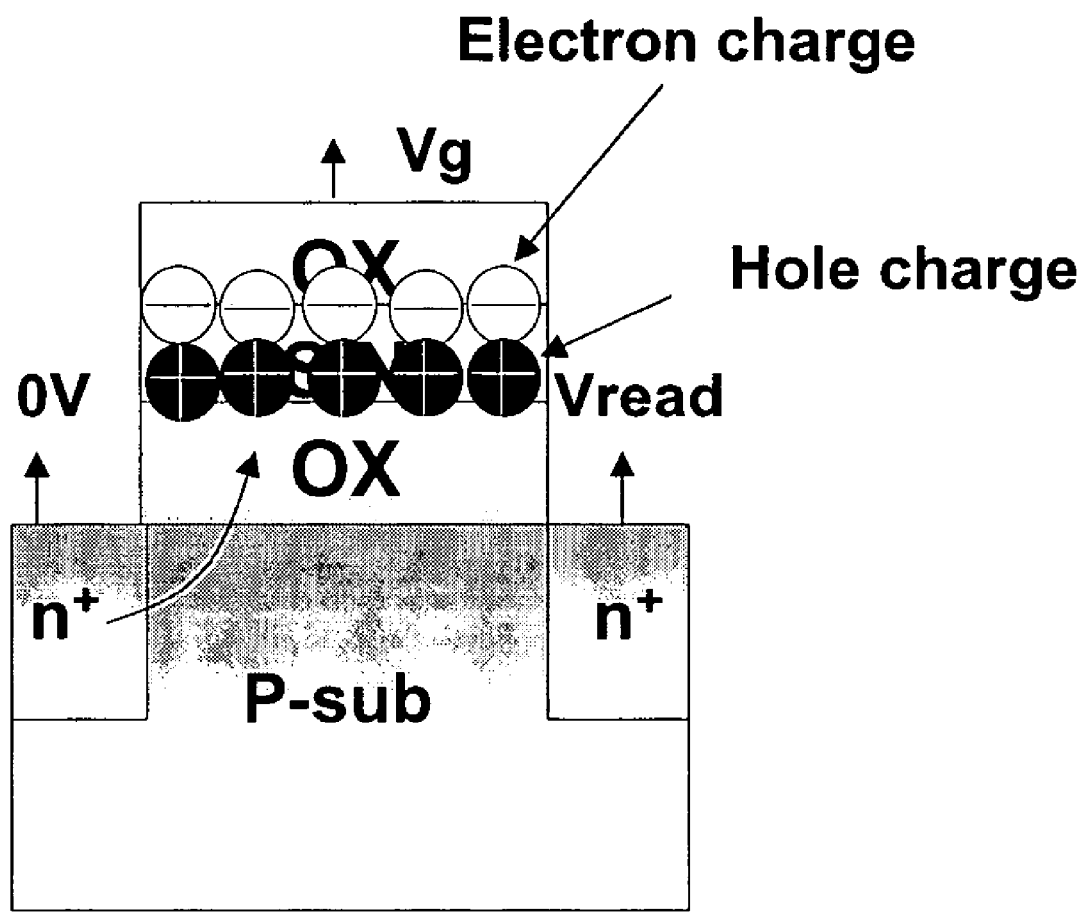
FIG. 10 shows a second bit programming operation of a two-bit non-volatile memory PHINES cell.

FIGS. 9 and 10 show a programming operation of a PHINES memory cell, wherein the PHINES cell is programmed by using Band-to-Band Hot Hole Tunneling (BT-BHHT) for completing a two-side program with one-side read (TPOR).

Specifically, FIG. 9 illustrates the first-side programming operation for the PHINES multi-level memory cell, wherein one charge bit (charge hole) is programmed (e.g., stored) in a second side of the charge storage layer. The programming operation stores the charge bit by conducting a hole charge from the first side of the substrate to the second side of the charge storage layer through the conduction path.

Similarly, FIG. 10 illustrates the second-side programming of the PHINES multi-level memory cell, wherein the charge bit is stored in the first side of the charge storage layer by conducting the hole charge from the second side of the substrate to the first side of the charge storage layer through the conduction path. The first and second sides of the substrate are the drain and source regions and the charges from these regions are conducted and stored into either side of the charge storage layer of the PHINES non-volatile multi-level memory cell.

Figure 11:
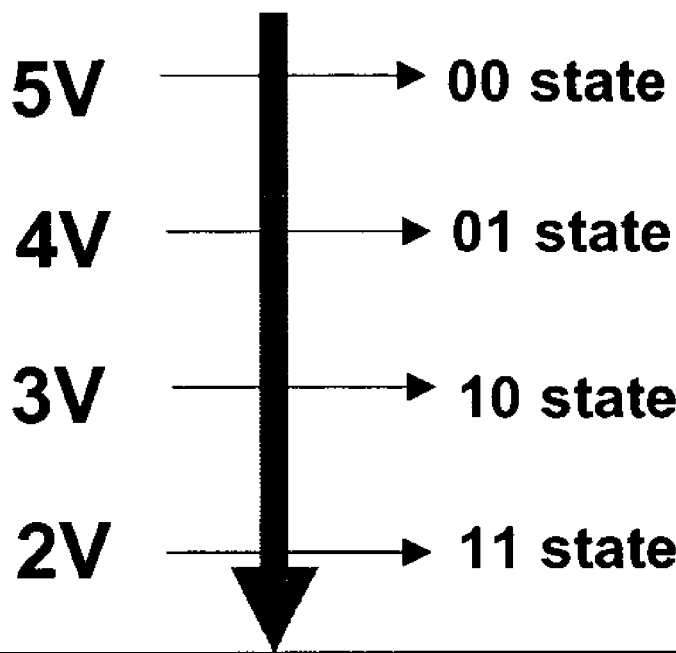
FIG. 11 shows a PHINES program level voltage threshold (Vt) distribution and its corresponding program state.
Figure 12:
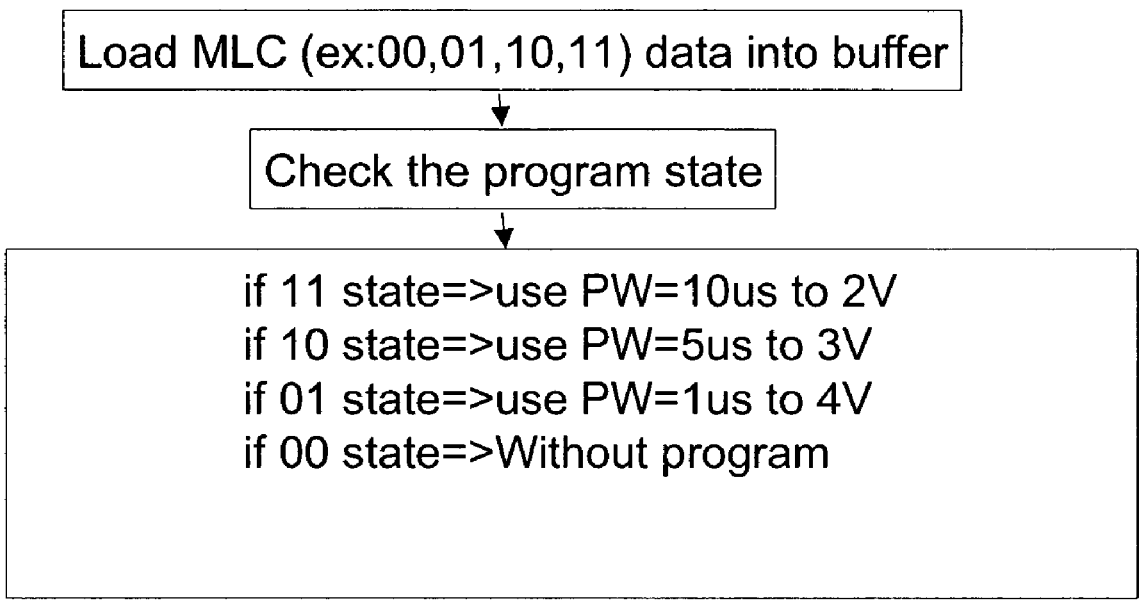
FIG. 12 shows a flow diagram for completing a PHINES two-program one-read (TPOR) operation utilizing the method of the present invention.

FIGS. 11 and 12 further illustrate the PHINES cell operation utilizing TPOR and BTBHHT, wherein the Multi-Level Cell (MLC) data is loaded in a buffer and is checked to determine program state and program level. The program level selects the pulse width that is used, wherein the program level is the voltage threshold (Vt).

FIG. 11 illustrates the correlation of the program levels as defined to the program state. This program level is used by the present invention for programming the PHINES cells from a high voltage threshold (Vt) to a low voltage threshold (Vt). Furthermore, the method of the present invention controls the convergence of the voltage threshold (Vt) distribution during the cell operation.

FIG. 12 illustrates a flow diagram for completing a two-side program and one-side read (TPOR) technique for the PHINES cell by using a Band-to-Band Hot Hole Tunneling (BTBHHT) programming technique. Program voltages are biased at a constant voltage level to facilitate the programming operation. Typical operating voltages for one embodiment of the present invention are, for example, defined for the gate at about -10VDC and for the drain at about 5.5VDC. The gate voltage for the PHINES cell has the opposite polarity as the gate voltage for the nitride trapping memory cell. Next, MLC data is loaded into a buffer and checked to determine the program state and pulse width for the program level for completing the operation. The program level and pulse width allow for controlling different voltage threshold (Vt) distribution for the same program time of the PHINES memory cell. Specifically, the pulse width is adjusted to control the convergence of the voltage threshold (Vt) distribution at the same programming time. Therefore, controlling the voltage threshold (Vt) allows for a simpler design than that of prior art methods, since the pulse width is the only parameter varied.

Figure 13:
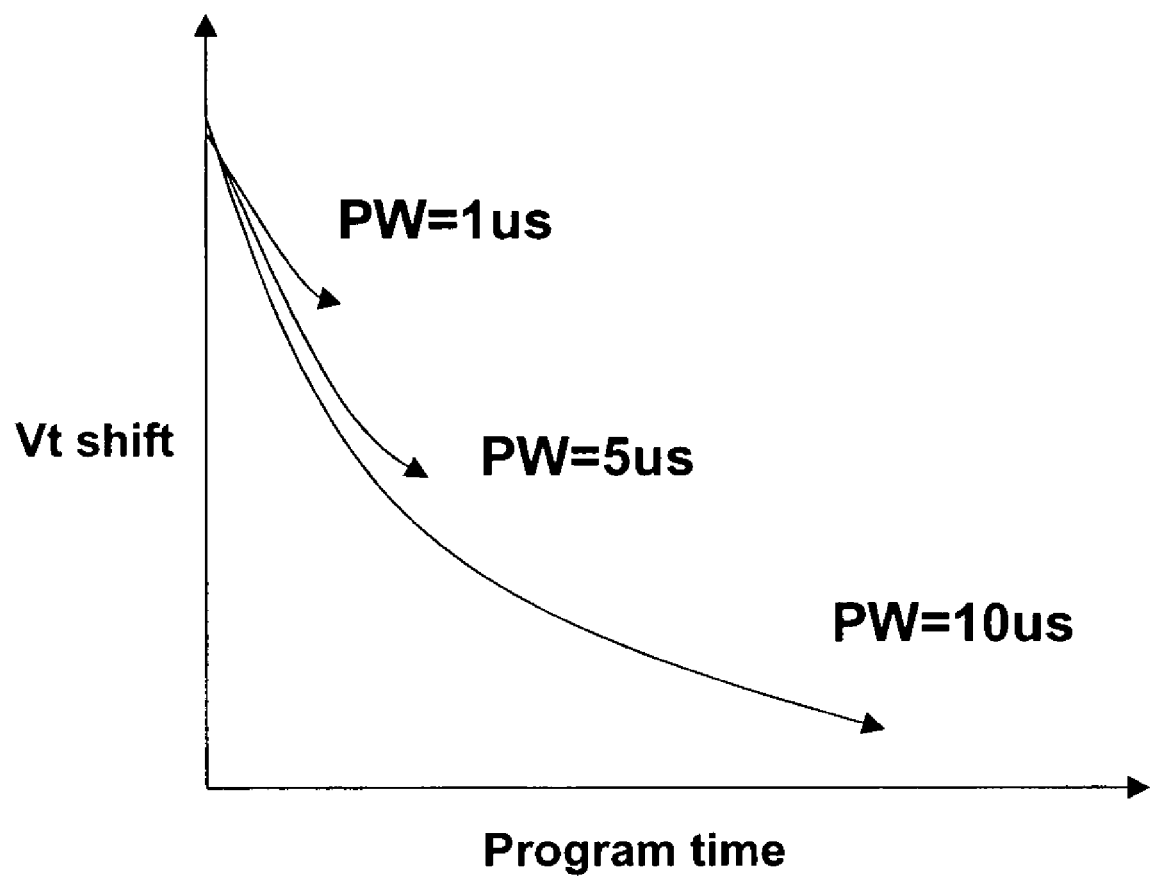
FIG. 13 shows theoretical voltage threshold (Vt) distributions according to the method of the present invention for a two-bit non-volatile memory PHINES cell.
Figure 14:
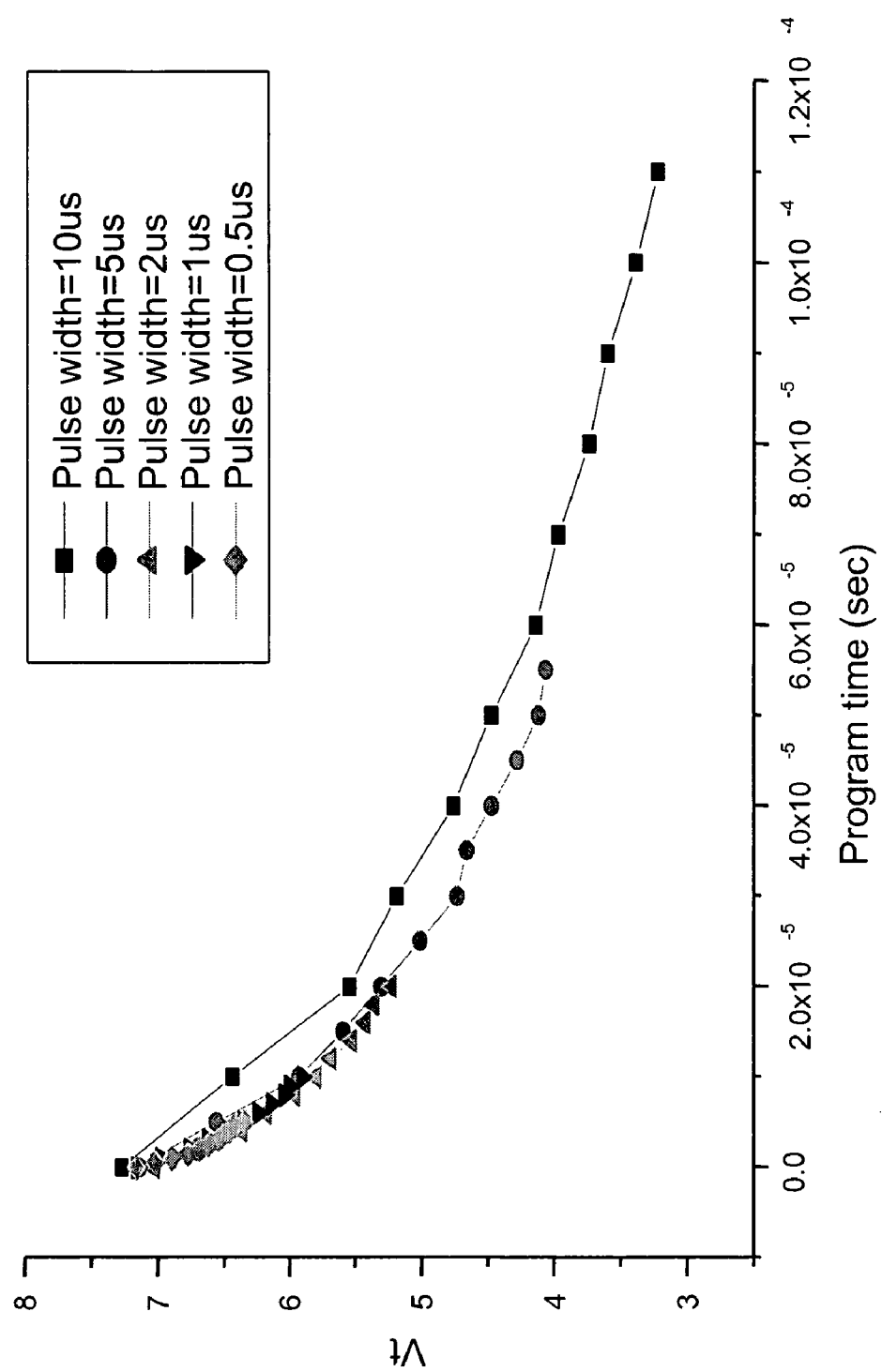
FIG. 14 shows experimental voltage threshold (Vt) distributions according to the method of the present invention for a two-bit non-volatile memory PHINES cell.

FIGS. 13 and 14 show the theoretical and the experimental voltage threshold (Vt) distributions for a PHINES memory cell, respectively. FIG. 13 illustrates a pulse width converged method to control voltage threshold (Vt) distribution and shows the effects of the pulse width on the voltage threshold (Vt) distribution of a PHINES non-volatile multi-level memory cell over the same program time.

FIG. 14 shows experimental voltage threshold (Vt) distributions for a PHINES multi-level memory cell utilizing TPOR-BTBHHT programming operations. Operating voltages (e.g., Vg=-10V and Vd=5.5V) are kept constant during the operation. The curves represent pulse widths having different time durations to illustrate the effects of the pulse width to the voltage threshold (Vt) distribution. In addition, other pulse widths under the same programming operation results in different voltage threshold (Vt) distributions (not shown).

The pulse width converged method to control voltage threshold (Vt) distributions providing a more efficient technique, better charge/data retention and a less complex way to perform programming and erasing operation on a multi-level non-volatile memory cell, in comparison to prior art methods. The pulse width method is used to improve the overall programming and erasing operation speed of the non-volatile multi-level memory cells. Furthermore, the pulse width method avoids issues related to over-programming and over-erasing by controlling a voltage margin of the voltage threshold (Vt) distributions, thereby increasing data reliability over the life of the memory cell.

It will be appreciated by those skilled in the art that changes could be made to the embodiments described above without departing from the broad inventive concept of the present invention. It is understood therefore, that the method of the present invention is not limited to the particular embodiments disclosed, but it is intended to cover modifications within the spirit and scope of the present invention as defined by the appended claims.

What is claimed is:

1. A method of performing operations on a plurality of non-volatile multi-level memory cells, the memory cells having at least a first, second, third and fourth program level, each program level corresponding to a different binary state with a corresponding voltage threshold distribution, the method comprising:
   (a) maintaining a constant operating voltage on the gate of each memory cell, the operating voltage being the same for all program levels; and
   (b) applying a predetermined pulse width of a programming pulse to each memory cell, the predetermined pulse width corresponding to the voltage threshold distribution corresponding to one of the first, second, third and fourth program levels,
   wherein the predetermined pulse width corresponding to each of the voltage threshold distributions of the first, second, third and fourth program levels is different from the predetermined pulse width corresponding to the voltage threshold distributions of the other three program levels.

2. The method of claim 1 wherein the multi-level memory cells are 2-bit memory cells and the four program levels correspond to the binary states of 00, 01, 10 and 11.

3. The method of claim 2 wherein the voltage threshold distribution (Vt) of the first, second, third and fourth program levels are about 5.0V, 4.0V, 3.0V and 2.0V, respectively.

4. The method of claim 1 wherein the method of performing operations is completed by using Two-side Program with One-side Read (TPOR) for programming.

5. The method of claim 4 wherein TPOR uses a technique selected from the group consisting of Channel Hot Electron (CHE) and Band-to-Band Hot Hole Tunneling (BTBHHT).

6. The method of claim 1 wherein one of the operations is a programming operation.

7. The method of claim 1 wherein the pulse width is used to program medium states of multi-level memory cells.

8. The method of claim 1 wherein a longer pulse width develops a larger voltage threshold (Vt) distribution and a shorter pulse width develops a smaller (Vt) distribution.

9. A method of performing operations on a plurality of non-volatile multi-level memory cells, the memory cells having at least a first, second, third and fourth program level, each program level corresponding to a different binary state with a corresponding voltage threshold distribution, the method comprising:

(a) maintaining a constant operating voltage on the gate of each memory cell; and (b) applying a predetermined pulse width of a programming pulse to each memory cell, the predetermined pulse width corresponding to the voltage threshold distribution of one of the first, second, third and fourth program level, wherein the non-volatile multi-level memory cells are nitride trapping memory cells, and the pulse width is about 5 nanoseconds to about 50 nanoseconds.

10. A method of performing operations on a plurality of non-volatile multi-level memory cells, the memory cells having at least a first, second, third and fourth program level, each program level corresponding to a different binary state with a corresponding voltage threshold distribution, the method comprising:

(a) maintaining a constant operating voltage on the gate of each memory cell; and (b) applying a predetermined pulse width of a programming pulse to each memory cell, the predetermined pulse width corresponding to the voltage threshold distribution of one of the first, second, third and fourth program level, wherein the non-volatile multi-level memory cells are PHINES cells, and the pulse width is about 1 nanoseconds to about 10 nanoseconds.

* * * * *